(12) United States Patent
Kathirgamanathan

(10) Patent No.: US 7,183,008 B1
(45) Date of Patent: *Feb. 27, 2007

(54) ELECTROLUMINESCENT MATERIALS

(75) Inventor: Poopathy Kathirgamanathan, North Harrow (GB)

(73) Assignee: South Bank University Enterprises Ltd., London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 09/830,897

(22) PCT Filed: Nov. 2, 1999

(86) PCT No.: PCT/GB99/03619

§ 371 (c)(1),
(2), (4) Date: May 2, 2001

(87) PCT Pub. No.: WO00/26323

PCT Pub. Date: May 11, 2000

(30) Foreign Application Priority Data

Nov. 2, 1998 (GB) .................................. 9823761.3

(51) Int. Cl.
*H05B 33/14* (2006.01)

(52) U.S. Cl. .................. 428/690; 428/917; 257/40; 257/103; 252/301.16; 252/301.26; 313/504; 313/506

(58) Field of Classification Search ............... 428/690, 428/917; 313/503, 504, 506; 564/523; 252/301.16, 301.26; 257/40, 103
See application file for complete search history.

(56) References Cited

U.S. PATENT DOCUMENTS

| | | | |
|---|---|---|---|
| 4,356,429 A | 10/1982 | Tang ........................... 313/503 |
| 4,455,364 A | 6/1984 | Sasa ............................ 430/299 |
| 4,720,432 A | 1/1988 | VanSlyke et al. ........... 428/457 |
| 4,885,211 A | 12/1989 | Tang et al. .................. 428/457 |
| 5,128,587 A | 7/1992 | Skotheim et al. ........... 313/504 |
| 5,281,489 A | 1/1994 | Mori et al. .................. 428/690 |
| 5,435,937 A | 7/1995 | Bell et al. ............... 252/301.18 |
| 5,496,597 A * | 3/1996 | Soininen et al. ............ 427/584 |
| 5,755,999 A | 5/1998 | Shi et al. ............... 252/301.16 |
| 5,757,026 A | 5/1998 | Forrest et al. ................. 257/40 |
| 5,834,053 A * | 11/1998 | Dye et al. ...................... 427/66 |
| 5,932,363 A * | 8/1999 | Hu et al. ..................... 428/690 |
| 6,025,677 A * | 2/2000 | Moss, III et al. ........... 313/503 |
| 6,074,734 A * | 6/2000 | Kawamura et al. ......... 428/220 |
| 6,524,727 B1 * | 2/2003 | Kathirgamanathan ....... 428/690 |

(Continued)

FOREIGN PATENT DOCUMENTS

EP 0087309 2/1983

(Continued)

OTHER PUBLICATIONS

Hosokawa Chishio, "Thin-Film EL Element", Publication No. 1-256584, Apr. 7, 1988, Laid Open Patent Gazette,.

(Continued)

*Primary Examiner*—Rena Dye
*Assistant Examiner*—Camie S. Thompson
(74) *Attorney, Agent, or Firm*—Goodwin Procter LLP

(57) ABSTRACT

A novel electroluminescent compound which emits blue or blueish purple light is a complex of a lanthanide or actinide and an organic complex e.g. mono(bathophenanthroline)thoriumIV chloride or mono(tripyridyl)yttrium chloride.

22 Claims, 6 Drawing Sheets

CIE 1931 x,y chromacity diagram showing approximate position of perceived colours

U.S. PATENT DOCUMENTS 6,565,995 B1 * 5/2003 Kathirgamanathan ....... 428/690
6,605,317 B1 * 8/2003 Kathirgamanathan ....... 427/162

FOREIGN PATENT DOCUMENTS

| EP | 0278629 | | 1/1988 |
| --- | --- | --- | --- |
| EP | 0461542 | | 6/1991 |
| EP | 0461542 A2 | * | 12/1991 |
| EP | 0556005 | | 2/1993 |
| EP | 0569827 | | 5/1993 |
| EP | 0744451 | | 5/1995 |
| EP | 0936844 | | 2/1999 |
| JP | 61037887 | | 2/1986 |
| JP | 63-174992 | * | 7/1988 |
| JP | 01-256584 | * | 10/1989 |
| JP | 06145146 | | 11/1992 |
| WO | 9802018 | | 1/1998 |
| WO | 9855561 | | 12/1998 |
| WO | 9858037 | | 12/1998 |

OTHER PUBLICATIONS

C. Hosokawa, "Thin Film EL Element", Publication No. I-282291, Nov. 14, 1989, Laid Open Patent Gazette.
U.S. Appl. No. 09/466,523, filed Dec. 17, 1999, Kathirgamanathan.
U.S. Appl. No. 09/857,287, filed Jun. 01, 2001, Kathirgamanathan.
U.S. Appl. No. 09/890,431, filed Jul. 30, 2001, Kathirgamanathan.
U.S. Appl. No. 09/857,300, filed Jun. 01, 2001, Kathirgamanathan.
U.S. Appl. No. 09/857,286, filed Jun. 06, 2001, Kathirgamanathan.
J. Kido, et al., Electroluminescence in a Terbium Complex, Chemistry Letters, 1990, pp. 657-660.
T. Wakimoto, et al., Organic EL cells with high luminous efficiency, Applied Surface Science 113/114 (1997) pp. 698-704.
J.Kido, et al., Bright red light-emitting organic electroluminescent devices having a europium complex as an emitter, Applied Physics Lett. 65 (17), Oct. 24, 1994, pp. 2124-2126.
L. K. Templeton, et al., Anomalous Scattering by Praseodymium, Samarium and Gadolinium and Structures of their Ethylenediaminetraacetate (edta) Salts, Acta. Cryst. (1982) B38, pp. 2155-2159.
N.C. Greenham, et al., Measurement of absolute photoluminescence quantum efficiences in conjugated polymers, Chemical Physics Letters, 241, (1995) pp. 89-96.
S. Dirr, et al., Luminescence enhancement in microcavity organic multilayer structures, Synthetic Metals1997, pp. 53-56.
J. Kido, et al., White-Light-Emitting Organic Electroluminescent Device Using Lanthanide Complexes, Appln. & Applied Physics, No. 35 (1996), pp. L394-L396.
K. Hensen, et al., Darstellung Von N-BZW.0-Chlormethylsilyl-Derivaten Der Amine 1,2,3,4-Tetrahydro-1,10-Phenanthrolin Und 8-Hydroxychinolin, Journal of Organometallic Chemistry, 209 (1981), pp. 17-23.
K. Machida, et al., Redox Behavior and Luminescence Property of Eoropium Polymer Complexes, Department of Applied Chemistry, Faculty of Engineering, Osaka University, Osaka, Japan, 1991, pp. 70-71.
K. Tsuchiya, et al., Complex Formation and its High Dispersion in the Simultaneous Vacuum Deposition of Copper and Phthalocyanine, Faculty of Engineering, Yamagata University, Yonezawa, Japan, 1998, pp. 149-154.
Hamada et al., "Blue Electroluminescence In Thin Films Of Azomethin-Zinc Complexes", J. Appl. Phys. vol. 32 pp. L511-513 (1993).
Hayashi et al., Syntheses and Structural Studies of Lanthanide Mixed Ligand Complexes Containing β-Diketone, Kidorui, vol. 28 pp. 210-211 (1996) XP-002132349.
Kepert et al., "Structural Systematics of Rare Earth Complexes. The Hydrated 1:1 Adducts Of 2, 2':6', 2"-Terpyridine Wiht The Lanthanoid (III) Chlorides"Aust. J. Chem. vol. 47, pp. 365-384 (1994) XP-002132347.
Kido et al., "Organic Electroluminescent Devices Using Langthanide Complexes II", Kidouri vol. 26, pp. 110-111 (1995) XP-002132346.
Liu et al., "Europium Complexes As Emitters In Organic Electroluminescent Devices", Synthetic Metals, CH, Lausanne, vol. 91, pp. 267-269 (1997) XP-002079652.
Junji Kido, et al. "Multilayer White Light-Emitting Organic Electroluminescent Device"SCIENCE, Mar. 1995, vol. 267, pp. 1332-1334.

* cited by examiner

CIE 1931 x,y chromacity diagram showing approximate position of perceived colours Example 1

Example 4

ELECTROLUMINESCENT MATERIALS

This application is a national stage application of PCT/GB99/03619 which was published in English under publication number WO 00/26323.

The present invention relates to electroluminescent materials and to devices incorporating them.

BACKGROUND OF THE INVENTION

Materials which emit light when an electric current is passed through them are well known and used in a wide range of display applications. Liquid crystal devices and devices which are based on inorganic semiconductor systems are widely used however these suffer from the disadvantages of high energy consumption, high cost of manufacture, low quantum-efficiency and the inability to make flat panel displays, reflectance problems, i.e. low visibility in bright conditions and a narrow viewing angle e.g. +/−45°.

Organic polymers have been proposed as useful in electroluminescent devices, but it is not possible to obtain pure colours, they are expensive to make and have a relatively low efficiency.

Another compound which has been proposed is aluminium quinolate, but this requires dopants to be used to obtain a range of colours and has a relatively low efficiency.

In an article in Chemistry letters pp 657–660, 1990 Kido et al disclosed that a terbium (III) acetyl acetonate complex was green electroluminescent and in an article in Applied Physics letters 65 (17) 24 Oct. 1994 Kido et al disclosed that a europium (III) triphenylene diamine complexes was red electroluminescent but these were unstable in atmospheric conditions and difficult to produce as films.

The complexes disclosed in these articles had a relatively low photoluminescent efficiency and were only able to produce green or red light and other colours could not be produced.

We have now discovered photoluminescent and electroluminescent compounds and materials which emit blue and purplish blue light.

SUMMARY OF THE INVENTION

According to the invention there is provided an photoluminescent compound which comprises an organic complex of a transition metal, lanthanide or an actinide and an organic ligand which photoluminescent compound emits light in the blue or purplish blue spectrum.

It has surprisingly been found that it is possible by choice of the metal and the organic ligand to form a complex which, when an electric current is applied across it will emit blue or purplish blue light.

The invention also provides an electroluminescent compound which comprises an organic complex of a transition metal, a lanthanide or an actinide and an organic ligand which electroluminescent compound emits light in the blue or purplish blue spectrum when an electric current is passed through it.

DETAILED DESCRIPTION OF THE PREFERRED EMBODIMENTS

Figure 1:
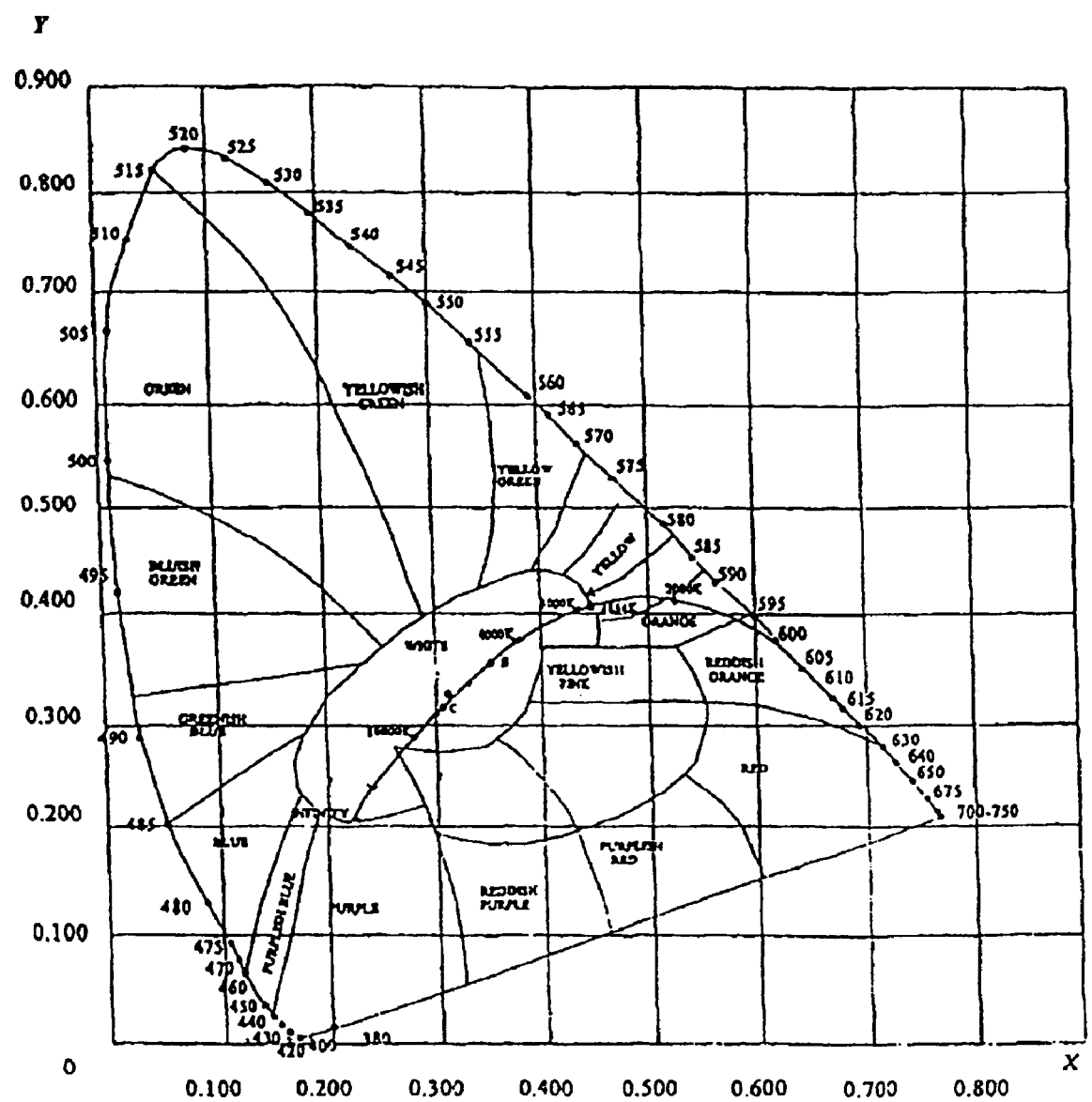
FIG. 1 is a chromacity diagram.
Figure 2:
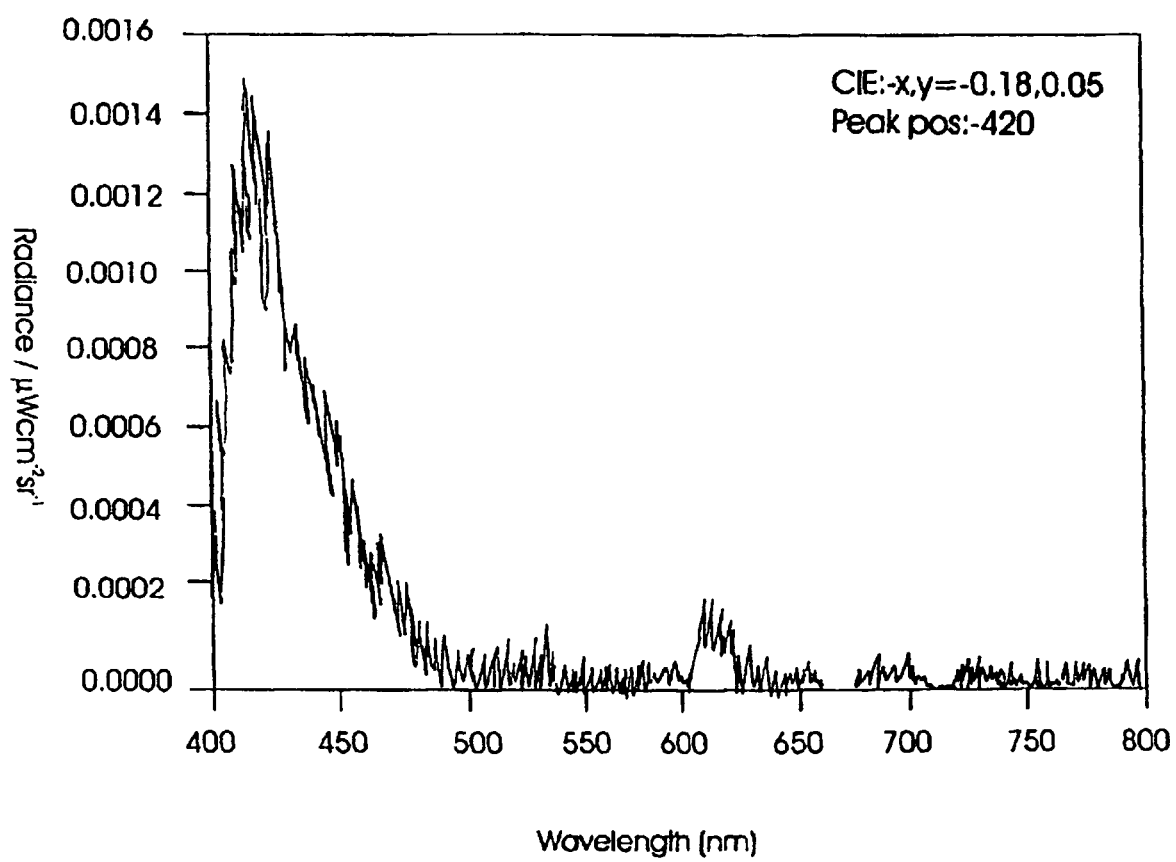
FIG. 2 is an electroluminescent spectrum for a device prepared in accordance with Example 1.
Figure 3:
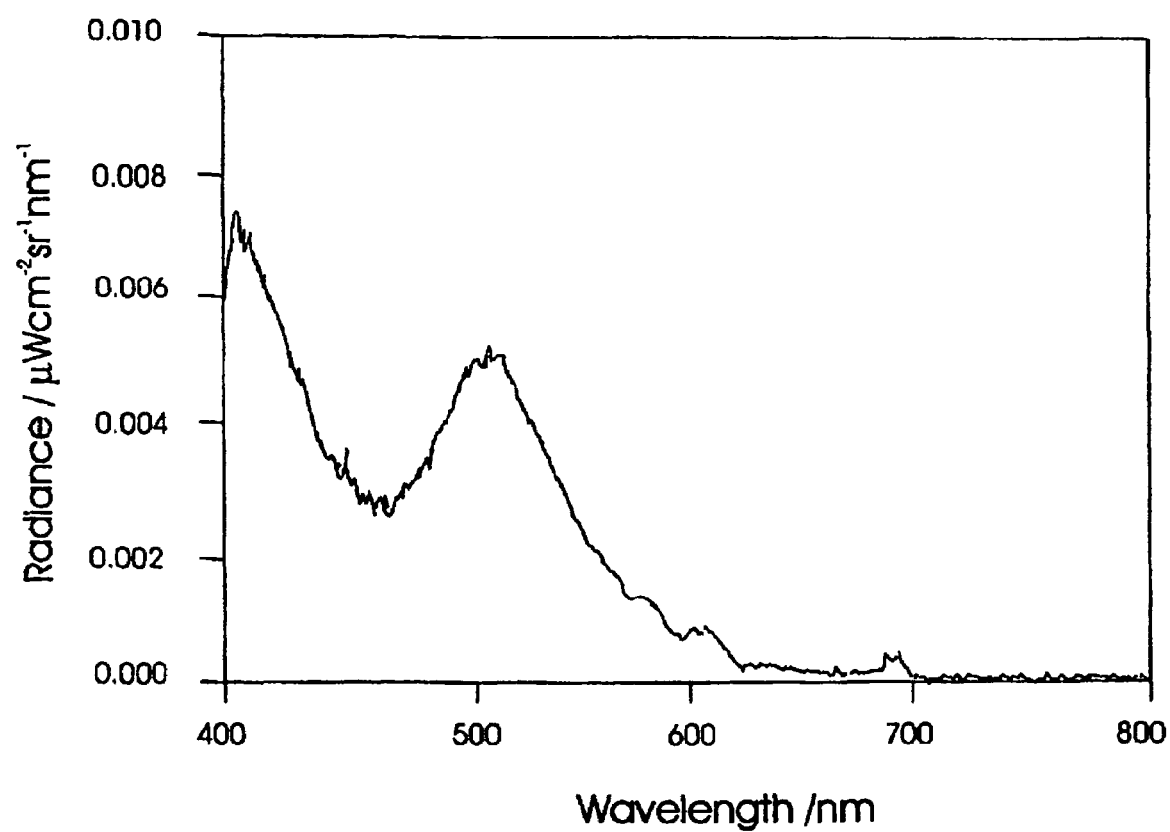
FIG. 3 is an electroluminescent spectrum for a device prepared in accordance with Example 2.
Figure 4:
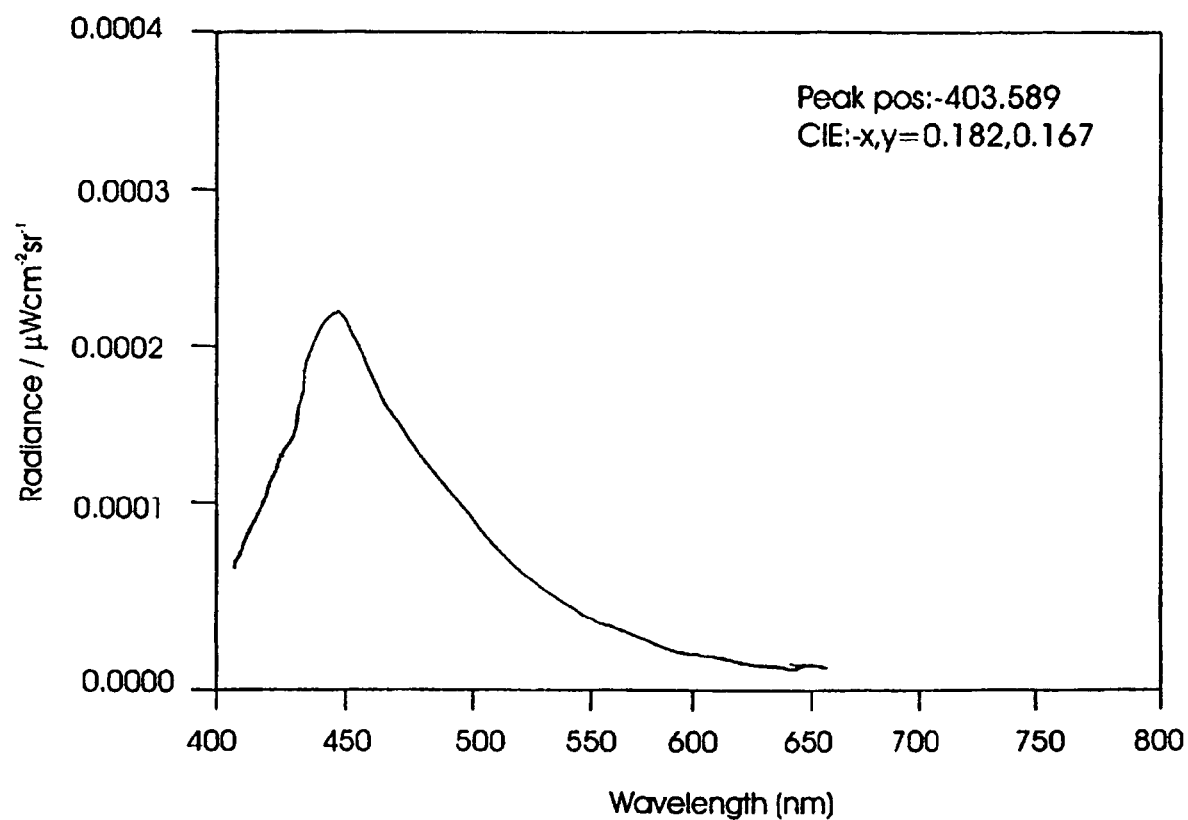
FIG. 4 is an electroluminescent spectrum for a device prepared in accordance with Example 3.
Figure 5:
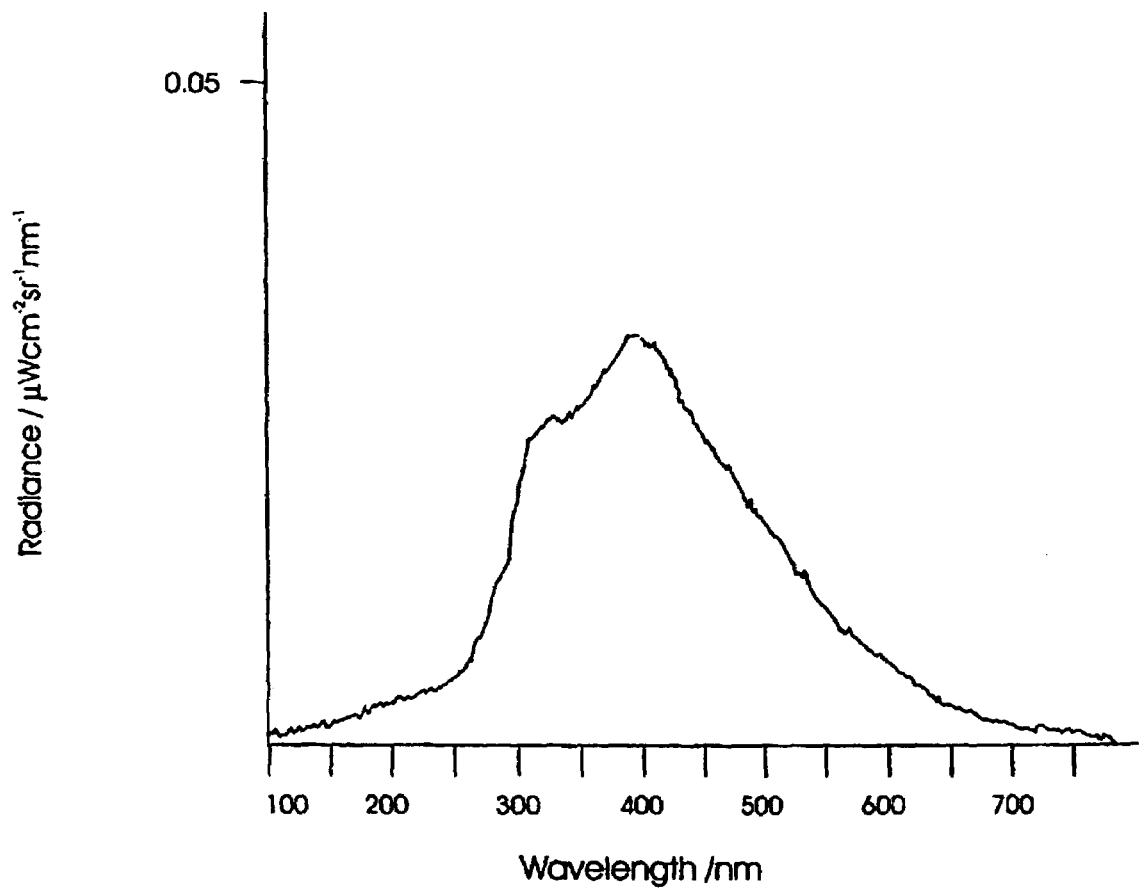
FIG. 5 is an electroluminescent spectrum for a device prepared in accordance with Example 4.
Figure 6:
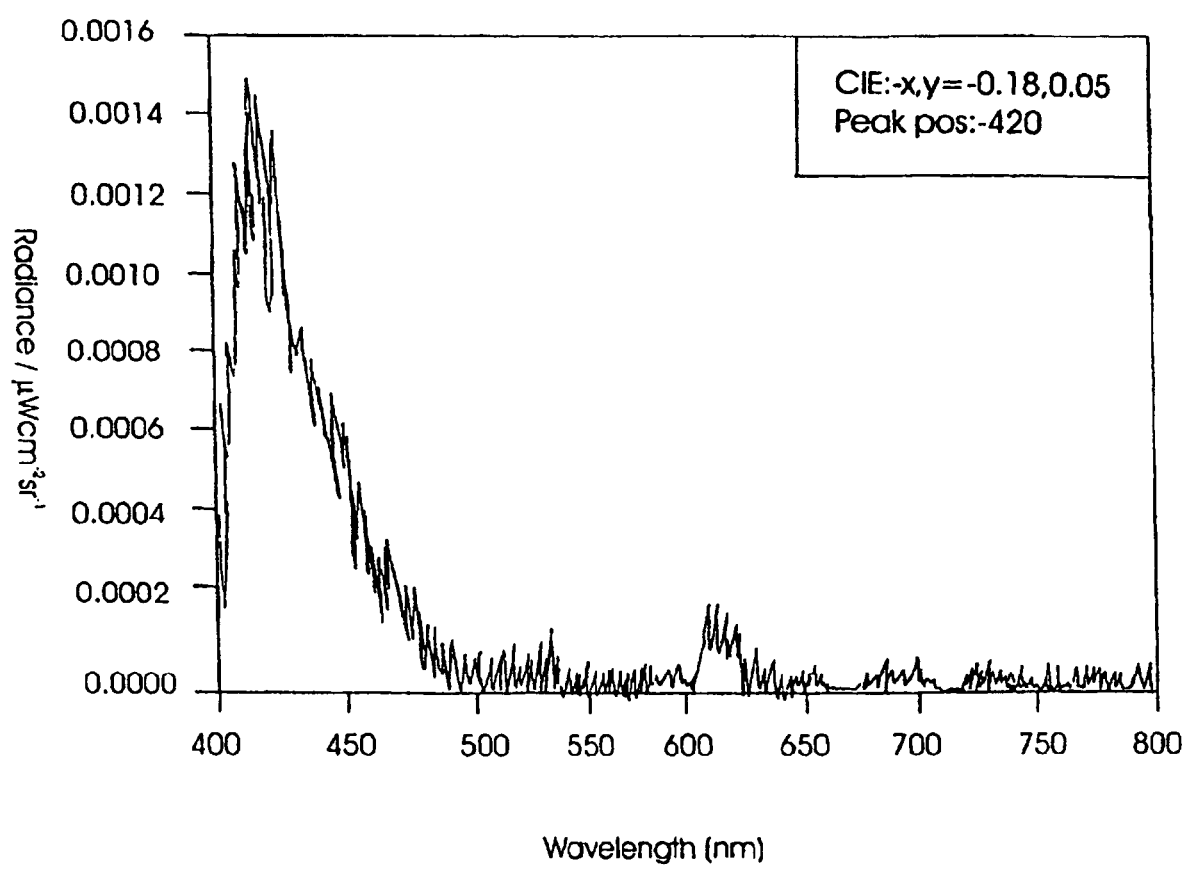
FIG. 6 is an electroluminescent spectrum for a device prepared in accordance with Example 5.

The colour of light is subjective and colours can be defined by co-ordinates on a two dimensional chart in which colours are areas on the chart and in the present invention the blue and purplish blue spectrum is defined as the area bounded by the co-ordinates in the colour chart CIE I931 a copy of which is shown in FIG. 1. The complexes of the invention enable light within the co-ordinates (0, 0) (0, 0.3) (0.3, 0) to be produced.

Light in the blue region of the spectrum is difficult to produce and hitherto it has not been possible to produce blue light by means of electroluminescence.

The preferred metals are thorium (IV), yttrium (III), gadolinium (III), europium (II), terbium(IV), cerium(IV) and cerium (III). A mixture of metals can be used to form mixed chelates.

The preferred ligands are

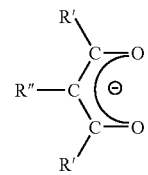

where R' is the same or different at different parts of the molecule and each R" and R' is a substituted or unsubstituted aromatic or heterocyclic ring structure or a hydrocarbyl or a fluorocarbon or R" is fluorine or hydrogen or R" is copolymerised with a monomer e.g. or R' is t-butyl and R" hydrogen.

Preferably each of R', R", and R' is an alkyl group preferably a —C(CH3) group,

Preferred complexes are TMHD (Tris(2,2,6,6-tetramethyl-3,5-heptanedionato), α', α", α'" tripyridyl, bathophen (4,7-diphenyl-1,1-phenanthroline), crown ethers and cryptans.

Particularly preferred complexes are the thorium bathophen, yttrium tripyridyl and TMHD, and europium TMHD complexes.

A novel complex with strong photoluminescent and electroluminescent properties is Eu(III)(TMHD)$_2$ complex which is stable in air. It would have been expected that such a Eu(II) complex would have been unstable in the presence of oxygen and it is surprising that this complex is air stable.

The complexes of the present invention can be used to form electroluminescent devices.

The electroluminescent devices of the invention comprise a transparent substrate which is a conductive glass or plastic material which acts as the anode, preferred substrates are conductive glasses such as indium tin oxide coated glass, but any glass which is conductive or has a conductive layer can be used. Conductive polymers and conductive polymer coated glass or plastics materials can also be used as the substrate. The electroluminescent material can be deposited on the substrate directly by evaporation from a solution of the material in an organic solvent. The solvent which is used will depend on the material for example alcohols such as ethanol, ketones such as acetone and methyl acetylacetonate, and chlorinated hydrocarbons such as dichloromethane are suitable in many cases.

Alternatively the material can be deposited by spin coating or by vacuum deposition from the solid state e.g. by sputtering or any other conventional method can be used.

In one embodiment of the invention there is a hole transporting layer deposited on the transparent substrate and the electroluminescent material is deposited on the hole transporting layer. The hole transporting layer serves to transport; holes and to block the electrons, thus preventing electrons from moving into the electrode without recombining with holes. The recombination of carriers therefore mainly takes place in the emitter layer.

Hole transporting layers are used in polymer electroluminescent, devices and any of the known hole transporting materials in film form can be used.

The hole transporting layer can be made of a film of an aromatic amine complex such as poly(vinylcarbazole), N,N'-diphenyl-N,N'-bis(3-methylphenyl)-1,1'-biphenyl-4, 4'-diamine (TPD), polyaniline etc.

Optionally dyes such as fluorescent laser dyes, luminescent laser dyes etc. can be included to modify the colour spectrum of the emitted light.

Preferably the electroluminescent material is mixed with an inert polymeric material such as a polyolefin e.g. polyethylene, polypropylene etc. and preferably polystyrene. Preferred amounts of the electroluminescent material in the mixture is from 95% to 5% by weight of active material and more preferably 25 to 20% by weight.

The hole transporting compound can optionally be mixed with the electroluminescent material in a ratio of 5–95% of the electroluminescent material to 95 to 5% of the hole transporting compound. In another embodiment of the invention there is a layer of an electron injecting material between the cathode and the electroluminescent material layer, this electron injecting material is preferably a metal complex such as a metal quinolate e.g. an aluminium quinolate which will transport electrons when an electric current is passed through it. Alternatively the electron injecting material can be mixed with the electroluminescent material and co-deposited with it.

In a preferred structure there is a substrate formed of a transparent conductive material which is the anode on which is successively deposit a hold transportation layer, the electroluminescent material layer and an electron injection layer which is connected to the cathode. The cathode can be any low work function metal e.g. aluminum, calcium, lithium, silver/magnesium alloys, etc.

The preparation of compounds of the invention are shown in the examples

EXAMPLE 1

Mono(bathophenanthroline)thorium(IV)chloride. Thorium(IV)chloride (5 mmol. 1.87 g) was dissolved in ethanol/water mixture (2:1 v/v) (75 ml) at 50° C. Bathophenanthroline (5 mmol, 1.66 g) was dissolved in a mixture of ethanol/dichloromethane (2:1 v/v) (75 ml) and added portionwise to the solution of the thorium salt. The mixture was reduced on a hotplate at 100° C. over one hour. The precipitate was filtered to give an off-white solid which was washed with diethylether (2×25 ml) and dried in vacuo to yield the product (1.9 g).

EXAMPLE 2

Mono($\alpha'$, $\alpha''$, $\alpha'''$ tripypyridyl)yttrium(III) chloride. Yttrium(III) chloride (2 mmol. 0.61 g) was dissolved in ethanol (100 ml) and $\alpha'$, $\alpha''$, $\alpha'''$ tripyridyl (2 mmol, 0.47 g) was added. The reaction mixture was warmed for 60 minutes at 50° C. and the solvents removed. The residue was washed with diethylether (2×25 ml) and dried in vacuo to give the product (0.80 g).

EXAMPLE 3

Tris(2,2,6,6-tetramethyl-3,5-heptanedionato)yttrium(III) mono($\alpha'$, $\alpha''$, $\alpha'''$ tripyridyl). The tris-chelate (1 mmol. 0.64 g) was dissolved in ethanol (100 ml) and $\alpha'$, $\alpha''$, $\alpha'''$ tripyridyl (1 mmol, 0.23 g) was added. The reaction mixture was warmed for 60 minutes at 50° C. and the solvents removed. The residue was washed with diethylether (2×25 ml) and dried in vacuo to give the product (0.50 g). Yield 57%.

EXAMPLE 4

Mono($\alpha'$, $\alpha''$, $\alpha'''$ tripyridyl)gadolinium(III) chloride. Gadolinium(III) chloride (0.37 g, 1 mmol) was dissolved in ethanol (150 ml) and $\alpha'$, $\alpha''$, $\alpha'''$ tripyridyl (0.23 g, 1 mmol) was added. The reaction mixture was heated under reflux for 1 hour and the solvent removed in vacuo to give the gadolinium adduct (Yield 0.50 g).

EXAMPLE 5

Bis(2,2,6,6-tetramethyl-3,5-heptanedionato)europium (II). The reaction was carried out under anhydrous conditions using dried glassware under dry nitrogen and using acetyl nitrile freshly distilled over phosphorus pentoxide. Europium(II) chloride (1.0 g, 5 mmol) was placed in a 250 ml three-neck round-bottom flask fitted with a condenser, two dropping funnels and nitrogen bubbler. Deoxygenated solution of the diketone (1.84 gms 10 mmol) in acetyl nitrile (50 ml) was placed in the first dropping funnel and deoxygenated acetyl nitrile (150 ml) was placed in the second dropping funnel. Both funnels were under nitrogen and fitted with nitrogen balloons. Acetyl nitrile was allowed to run into the flask and the mixture stirred at 50° C. (oil bath) until dissolution. The diketone solution was then added to the flask and the reaction mixture refluxed for one hour and allowed to cool under nitrogen overnight. The dry diethylether and dried in vacuo at 60° C. (Yield 0.82 g). The filtrate was dried to give pale yellow tris(2,2,6,6-tetramethyl-3,5-heptaneionato)europium(II). (Yield 0.90 g).

Electroluminescent devices were fabricated and tested.

I. Device Fabrication

An ITO coated glass piece (1×1 cm$^2$ cut from large sheets purchased from Balzers. Switzerland) had a portion etched out with concentrated hydrochloric acid to remove the ITO and was cleaned and placed on a spin coater (CPS 10 BM, Semitec. Germany) and spun at 2000 rpm for 30 seconds, during which time the solution of the electroluminescent compound was dropped onto it dropwise by a pipette.

Alternatively the electroluminescent compound was vacuum evaporated onto the ITO coated glass piece by placing the substrate in a vacuum coater and evaporating the electroluminescent compound at $10^{-5}$ to $10^{-6}$ torr onto the substrate.

The organic coating on the portion which had been etched with, the concentrated hydrochloric acid was wiped with a cotton bud.

The coated electrodes were stored in a vacuum desiccator over calcium sulphate until they were loaded into a vacuum coater (Edwards, $10^{-6}$ torr) and aluminium top contacts made. The active area of the LED's was 0.08 cm2 by 0.1 cm$^2$ the devices were then kept in a vacuum desiccator until the electroluminescence studies were performed.

The ITO electrode was always connected to the positive terminal. The current vs. voltage studies were carried out on a computer controlled Keithly 2400 source meter.

Electroluminescence spectra were recorded by means of a computer controlled charge coupled device on Insta Spec photodiode array system model 77II2 (Oriel Co. Surrey, England)

2. Photoluminescence Measurements

Photoluminescence was excited using 325 nm line of Liconix 4207 NB, He/Cd laser. The laser power incident at the sample (0.3 mWcm$^{-2}$) was measured by a Liconix 55PM laser power meter. The radiance calibration was carried out using Bentham radiance standard (Bentham SRS8, Lamp current 4,000A, calibrated by National Physical laboratories, England. The PL studies were carried out on samples or films. The Complexes of the examples were tested and the results shown in the Table and the Spectra attached as FIGS. 2 to 6

TABLE

| Example | PL % | λmax/nm | CIE x | CIE y | Colour |
|---------|------|---------|-------|-------|--------|
| 1 | 1.0 | 450 | 0.17 | 0.15 | Purple |
| 2 | 6.0 | 410, 520 | 0.21 | 0.32 | Greenish Blue |
| 3 | 0.03 | 460 | 0.21 | 0.29 | White |
| 4 | 16 | 320, 450 | | | Purple |
| 5 | 0.9 | 420 | 0.18 | 0.05 | Purple |

I claim:

1. An electroluminescent device which comprises (i) a transparent substrate (ii) an electroluminescent layer comprising an electroluminescent compound which comprises an organic complex of a metal selected from the group consisting of thorium (IV), yttrium (III), gadolinium (III), europium (II), terbium (III), cerium (IV) and mixtures thereof and an organic ligand which electroluminescent compound emits light in the blue or purplish blue spectrum when an electric current is passed through it and in which the organic ligand has the formula

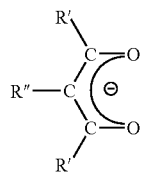

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH$_3$) group, or the ligand is selected from TMHD, α', α", α'" tripyridyl bathophen (4,7-diphenyl-1,10-phenanthroline), crown ethers and cryptands and (iii) a cathode.

2. An electroluminescent device as claimed in claim 1 in which the transparent substrate comprises a conductive glass or plastic material which acts as the anode.

3. An electroluminescent device as claimed in claim 1 in which there is a hole transporting layer comprising a hole transporting material deposited on the transparent substrate and the electroluminescent layer is deposited on the hole transporting layer.

4. An electroluminescent device as claimed in claim 3 in which the hole transporting material is an aromatic amine complex.

5. An electroluminescent device as claimed in claim 4 in which the hole transporting material comprises at least one selected from the group consisting of poly(vinylcarbazole), N,N'-diphenyl-N,N'-bis(3-methylphenyl)-1, -biphenyl-4,4' diamine (TPD) and polyaniline.

6. An electroluminescent device as claimed in claim 1 in which there is a layer of an electron injecting material between the cathode and the electroluminescent material layer.

7. An electroluminescent device as claimed in claim 6 wherein the electron injecting material is a metal complex or oxadiazole or an oxadiazole derivative.

8. an electroluminescent device as claimed in claim 7 in which the electron injecting material is an aluminium quinolate or 2-(4-biphenyl)-5-(4-tert-butylphenyl)-1,3,4 oxadiazole.

9. An electroluminescent device as claimed in claim 1 wherein the electroluminescent layer includes a dye.

10. An electroluminescent device as claimed in claim 1 which the cathode includes one selected from the group consisting of aluminum, magnesium, lithium, calcium and magnesium silver alloy.

11. An electroluminescent device as claimed in claim 1 comprising a plurality of electroluminescent layers.

12. An electroluminescent device which comprises (i) a transparent substrate selected from the group consisting of conductive glass and plastic material (ii) an electroluminescent layer deposited on the hole transporting layer, the electroluminescent layer comprising an electroluminescent compound which comprises an organic complex of terbium (III) and an organic ligand which electroluminescent compound emits light in the blue or purplish blue spectrum when an electric current is passed through it and in which the organic ligand has the formula

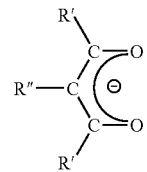

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH$_3$) group, or the ligand is selected from TMHD, α' α", α'" tripyridyl bathophen (4,7-diphenyl-1,10-phenanthroline), crown ethers and cryptands and (iii) a cathode.

13. An electroluminescent device which comprises (i) a transparent substrate (ii) a hole transporting layer deposited on the transparent substrate (iii) an electroluminescent layer deposited on the hole transporting layer, the electroluminescent layer comprising an electroluminescent compound which comprises an organic complex of terbium (III) and an organic ligand which electroluminescent compound emits light in the blue or purplish blue spectrum when an electric current is passed through it and in which the organic ligand has the formula

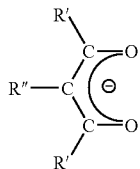

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH$_3$) group, or the ligand is selected from TMHD, α' α", α'" tripyridyl bathophen (4,7-diphenyl-1,10-phenanthroline), crown ethers and cryptands and (iv) a cathode.

14. An electroluminescent device which comprises (i) a transparent substrate (ii) an electroluminescent layer, the electroluminescent layer comprising an electroluminescent compound which comprises an organic complex of terbium (III) and an organic ligand which electroluminescent compound emits light in the blue or purplish blue spectrum when an electric current is passed through it and in which the organic ligand has the formula

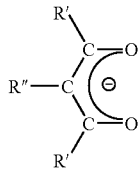

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH3) group, or the ligand is selected from TMHD, α' α", α'" tripyridyl bathophen (4,7-diphenyl-1,10-phenanthroline), crown ethers and cryptands (iii) a hole transporting material comprising an aromatic amine complex mixed with the electroluminescent layer in a ratio of 5 to 95% of the electroluminescent compound to 95 to 5% of the hole transporting material and (iv) a cathode.

15. An electroluminescent device as claimed in claim 14 in which the hole transporting material comprises at least one selected from the group consisting of poly(vinylcarbazole), N,N'-diphenyl-N,N'-bis(3-methylphenyl)-1, -biphenyl-4,4' diamine (TPD) and polyaniline.

16. An electroluminescent device which comprises (i) a transparent substrate (ii) an electroluminescent layer, the electroluminescent layer comprising an electroluminescent compound which comprises an organic complex of terbium (III) and an organic ligand which electroluminescent compound emits light in the blue or purplish blue spectrum when an electric current is passed through it and in which the organic ligand has the formula

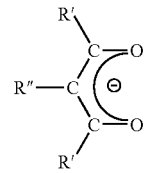

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH$_3$) group, or the ligand is selected from TMHD, α' α", α'" tripyridyl bathophen (4,7-diphenyl-1,10-phenanthroline), crown ethers and cryptands (iii) a cathode and (iv) a layer of an electron injecting material between the cathode and the electroluminescent layer.

17. An electroluminescent device which comprises (i) a transparent substrate (ii) an electroluminescent layer, the electroluminescent layer comprising an electron injecting material selected from the group consisting of a metal complex, oxadiazole, and an oxadiazole derivative, and an electroluminescent compound, the electroluminescent compound comprising an organic complex of terbium (III) and an organic ligand which electroluminescent compound emits light in the blue or purplish blue spectrum when an electric current is passed through it and in which the organic ligand has the formula

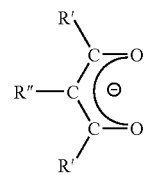

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH$_3$) group, or the ligand is selected from TMHD, α' α", α'" tripyridyl bathophen (4,7-diphenyl-1,10-phenanthroline), crown ethers and cryptands (iii) a cathode.

18. An electroluminescent device as claimed in claim 17 which the electron injecting material is an aluminum quinolate or 2-(4-biphenyl)-5-(4-tert-butylphenyl)-1,3,4 oxadiazole.

19. An electroluminescent device which comprises (i) a transparent substrate (ii) an electroluminescent layer, the electroluminescent layer comprising a dye and an electroluminescent compound, the electroluminescent compound comprising an organic complex of terbium (III) and an organic ligand which electroluminescent compound emits light in the blue or purplish blue spectrum when an electric current is passed through it and in which the organic ligand has the formula

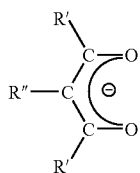

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH₃) group, or the ligand is selected from TMHD, α' α", α'" tripyridyl bathophen (4,7-diphenyl-1,10-phenanthroline), crown ethers and cryptands (iii) a cathode.

20. An electroluminescent device which comprises (i) a transparent substrate (ii) an electroluminescent layer, the electroluminescent layer comprising an electroluminescent compound comprising an organic complex of terbium (III) and an organic ligand which electroluminescent compound emits light in the blue or purplish blue spectrum when an electric current is passed through it and in which the organic ligand has the formula

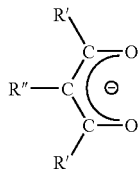

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH₃) group, or the ligand is selected from TMHD, α' α", α'" tripyridyl bathophen (4,7-diphenyl-1,10-phenanthroline), crown ethers and cryptands (iii) a cathode comprising one selected from the group consisting of aluminum, magnesium, lithium, calcium and magnesium silver alloy.

21. An electroluminescent device which comprises (i) a transparent substrate (ii) a plurality of electroluminescent layers, at least one electroluminescent layer comprising an electroluminescent comprising an organic complex of terbium (III) and an organic ligand which electroluminescent compound emits light in the blue or purplish blue spectrum when an electric current is passed through it and in which the organic ligand has the formula

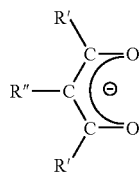

where R' may be the same or different at different parts of the molecule and each of R" and R' is a substituted or unsubstituted aromatic or heterocyclic ring structure or a hydrocarbyl or a fluorocarbon or R" is fluorine or hydrogen or R" is copolymerised with a monomer or is an alkyl group optionally a —C(CH₃) group, or the ligand is selected from TMHD, α' α", α'" tripyridyl bathophen (4,7-diphenyl-1,10-phenanthroline), crown ethers and cryptands (iii) a cathode.

22. A composition which comprises an inert polymer and from 5% to 95% by weight of an electroluminescent compound having the formula Eu(II)(TMHD)₂.

* * * * *